United States Patent [19]

Shankar et al.

[11] Patent Number: 5,404,055
[45] Date of Patent: Apr. 4, 1995

[54] INPUT ROUTING POOL

[75] Inventors: Kapil Shankar, Fremont; Cyrus Y. Tsui, Los Altos, both of Calif.

[73] Assignee: Lattice Semiconductor Corporation, Hillsboro, Oreg.

[21] Appl. No.: 115,533

[22] Filed: Sep. 1, 1993

[51] Int. Cl.$^6$ .................. G06F 7/38; H01L 25/00
[52] U.S. Cl. .................. 326/41; 365/189.08; 326/39
[58] Field of Search ............. 307/465, 465.1; 365/189.08, 185, 230.02, 189.02

[56] References Cited

U.S. PATENT DOCUMENTS

| | | | |
|---|---|---|---|
| 4,855,954 | 8/1989 | Turner | 365/185 |
| 4,896,296 | 1/1990 | Turner | 365/189.8 |
| 5,191,243 | 3/1993 | Shen | 307/465 |
| 5,220,215 | 6/1993 | Douglas | 307/465 |
| 5,268,598 | 12/1993 | Pedersen | 307/465 |

*Primary Examiner*—Eugene R. LaRoche
*Assistant Examiner*—Son Mai
*Attorney, Agent, or Firm*—Skjerven, Morrill, MacPherson, Franklin & Friel; Edward C. Kwok

[57] ABSTRACT

The disclosed structure and method route an input signal received at an input/output pin through multiple input/output cells to a routing resource. In one embodiment, each input/output cell can be programmed to provide either a combinatorial input signal or a registered input signal. Increased flexibility is achieved by routing the registered input signal or the combinatorial input signal of each cell to a routing resource via one or more I/O cells.

12 Claims, 16 Drawing Sheets

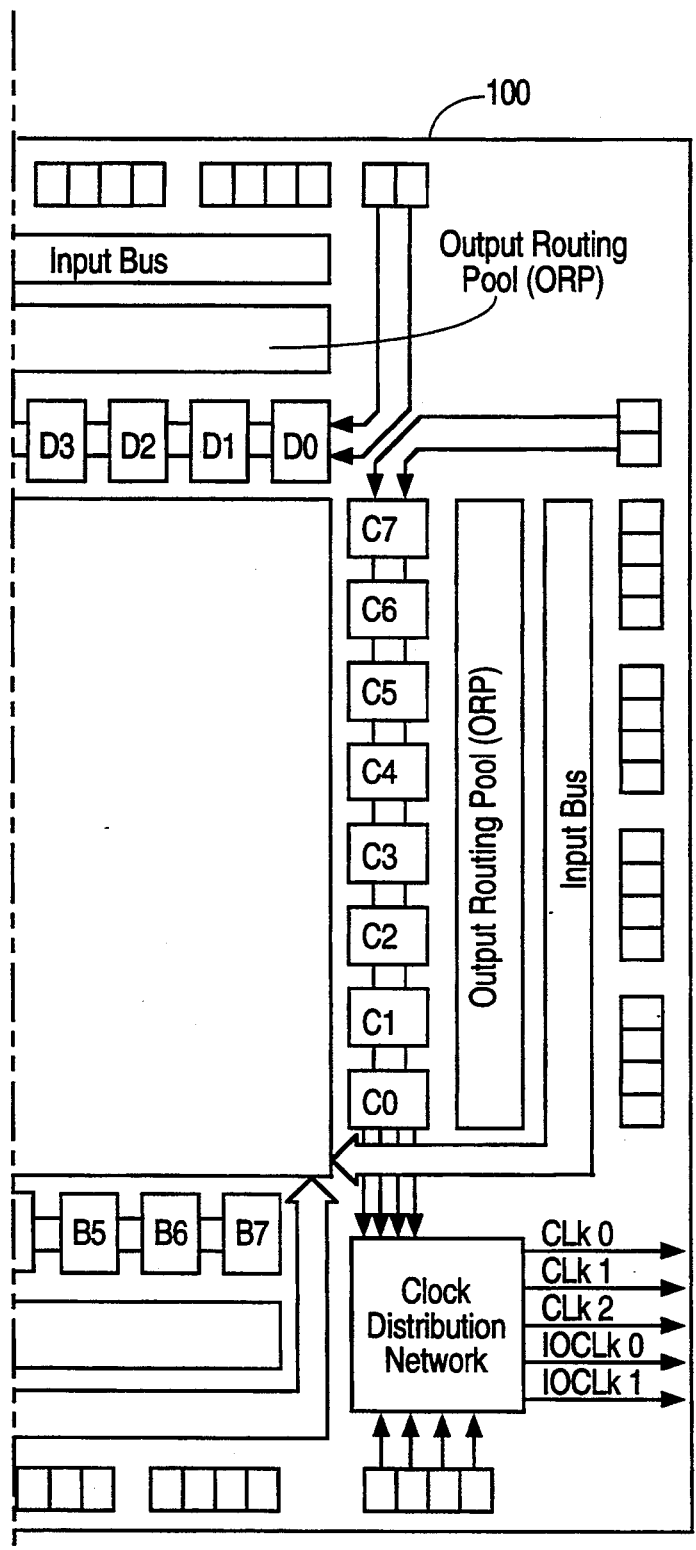
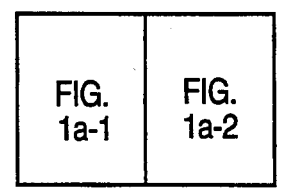
FIG. 1a-2
(PRIOR ART)

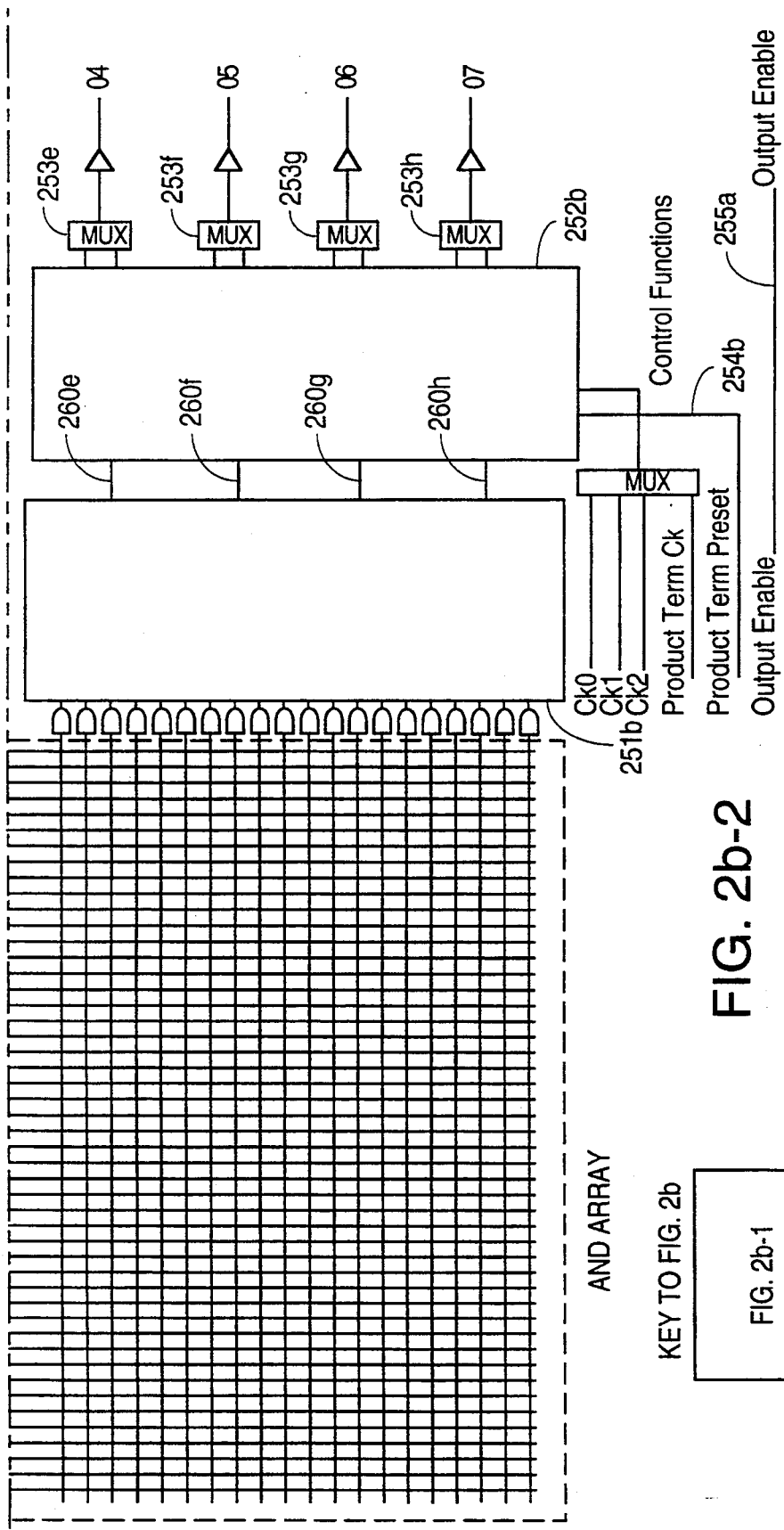

INPUT ROUTING POOL

BACKGROUND OF THE INVENTION

1. Field of the Invention

The present invention relates to programmable logic circuits, and in particular, relates to the configuration of input/output resources in a programmable logic circuit.

2. Discussion of the Related Art

Two examples of high density programmable logic arrays are the programmable Large Scale Integration (pLSI) devices and the in-system programmable Large Scale Integration (ispLSI) devices from Lattice Semiconductor Corporation, Hillsboro, Oreg. An ispLSI device is reprogrammable in its application without being removed from the circuit board. In-system programming techniques are discussed in U.S. Pat. No. 4,855,954 (entitled "In-system Programmable Logic Device with Four Dedicated Terminals" to Turner et al, issued Aug. 8, 1989), U.S. Pat. No. 4,761,768 (entitled "Programmable Logic Device" to Turner et al, issued Aug. 2, 1988), and U.S. Pat. No. 4,896,296 (entitled "Programmable Logic Device Configurable I/O Cell", to Turner et al, issued Jan. 23, 1990). The in-system programming techniques discussed in these U.S. Patents are hereby incorporated by reference. Programmable logic devices can also be implemented in both volatile and nonvolatile memory technologies (e.g. electrical eraseable programmable read-only memory or $E^2$-PROM).

FIG. 1a shows a block diagram of a prior art device 100, which can be implemented as either a pLSI device or an ispLSI device. As shown in FIG. 1a, device 100 comprises 32 generic logic blocks (GLBs) A0-A7, B0-B7, C0-C7 and D0-D7. Each GLB includes a number of input terminals, a logic array for implementing logic functions and a number of output terminals. The signals at the GLB's input terminals originate either from the routing pool 101, or directly from input/output (I/O) pins, which are shown in FIG. 1 around the periphery of the device, e.g. I/O pin 102a. The signals of the output terminals of a GLB can be routed to both output routing pool 103 and routing pool 101. Output routing pool 103 routes signals between a group of GLBs and a group of I/O pins. Each I/O pin of pLSI device 100 is associated with an input/output cell ("I/O cell"), which is programmable to define whether the I/O pin is an input pin, an output pin or a bidirectional pin.

Routing pool 101 is an interconnection resource for interconnection among the GLBs. Routing pool 101 receives input signals from both the I/O pins and the output terminals of the GLBs and provides the signals received to the input terminals of the GLBs. Routing pool 101 provides connectivity between any pair of GLBs in pLSI device 100.

In FIG. 1a, four groups of GLBs A0-A7, B0-B7, C0-C7 and D0-D7 are shown. Each group of GLBs, together with its output routing pool, the associated I/O cells, and the associated I/O pins, form a structure called a "macroblock". In the prior art, the signal received at each I/O cell is routed to one input terminal of routing pool 101. In addition, two additional input pins are provided per megablock to receive two additional signals into global routing pool.

SUMMARY OF THE INVENTION

The present invention provides in a programmable logic device, which has a number of programmable logic blocks and a routing resource for interconnecting the programmable logic blocks, a structure capable of routing an input signal received at one input/output pin ("I/O pin") to multiple interconnections in the routing resource. In one embodiment, the input signals are routed by multiplexors in input/output cells ("I/O cells"). In this manner, additional flexibility is achieved, since each I/O pin can be associated with more than one I/O cell.

In one embodiment, each I/O cell is associated with one I/O pin, and each I/O cell include a multiplexor which selects an input signal from not only the input signal received at the associated I/O pin, but input signals received at I/O pins associated with neighboring I/O cells. In accordance with another aspect of the present invention, each I/O cell provides a registered input signal derived from the input signal received at its associated I/O pin and provides the registered input signal to a neighboring I/O cell.

The structure of the present invention can be implemented by either a volatile or a non-volatile memory technology. In addition, the structure of the present invention can be implemented using in-system programming techniques.

The present invention is better understood upon consideration of the following detailed description in conjunction with the accompanying drawings.

BRIEF DESCRIPTION OF THE DRAWINGS

FIG. 2b shows a typical GLB 250 of the programmable logic device 200 of FIG. 2a.

DETAILED DESCRIPTION OF THE PREFERRED EMBODIMENT

Figures 1, 1A:
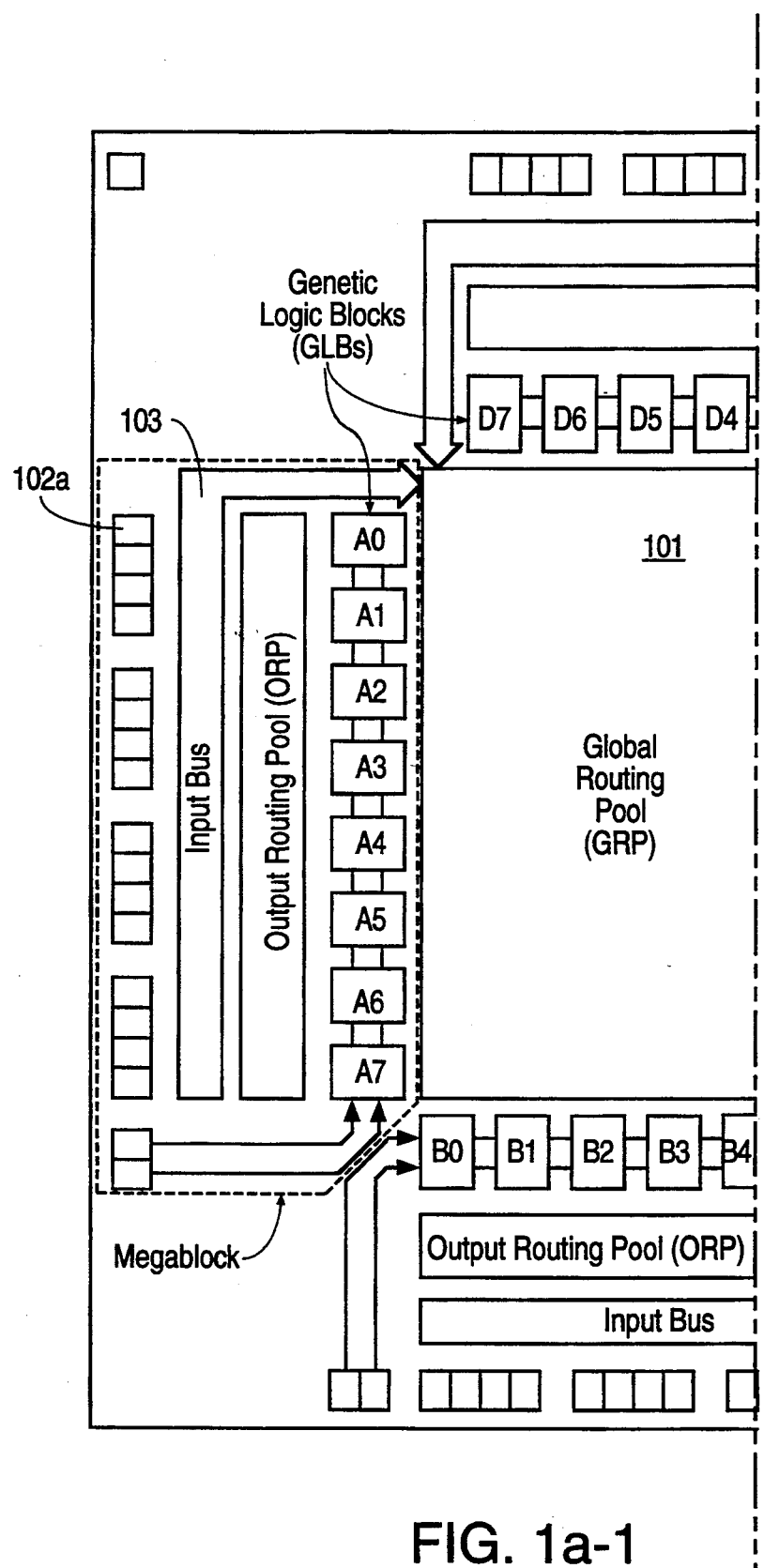
FIG. 1a shows a pLSI device 100 in the prior art using a single routing pool.
Figure 1B:
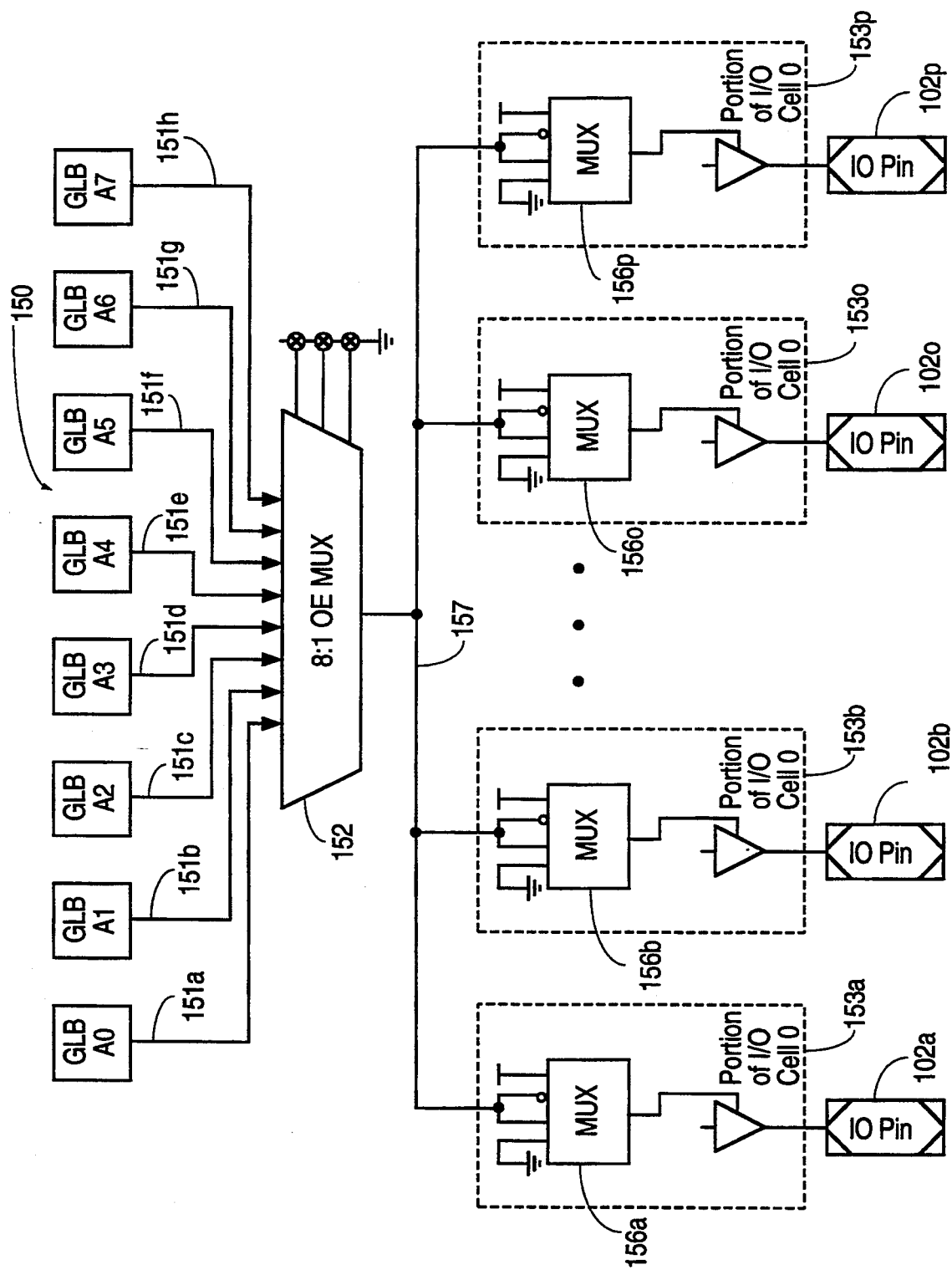
FIG. 1b shows a structure for generating output enable signals for the I/O pins for the pLSI device 100 of FIG. 1.
Figures 1, 2A:
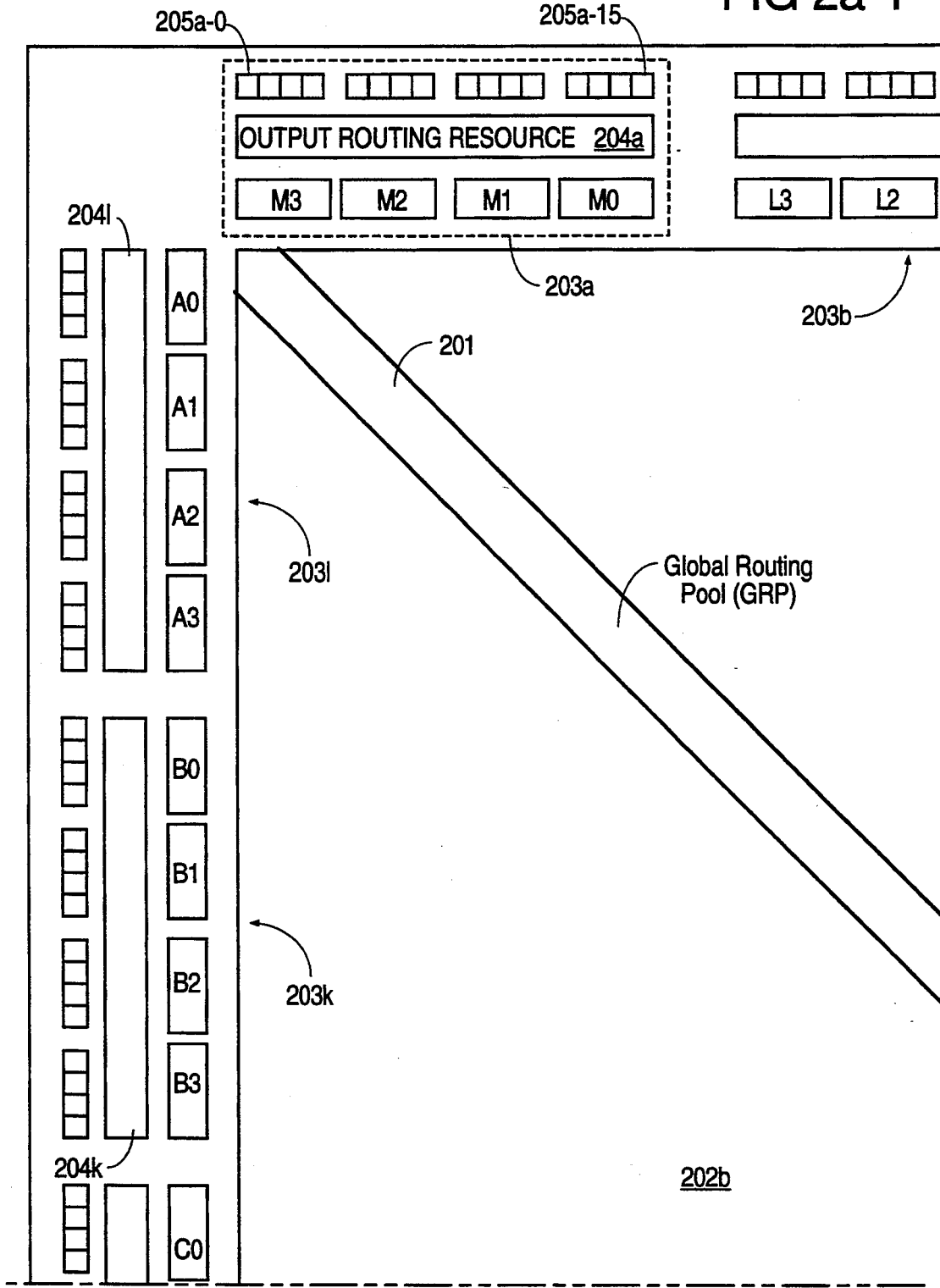
FIG. 2a shows a programmable logic device 200 having a global routing pool 201 for providing connectivity between two local routing pools 202a and 202b.
Figures 2, 2A:
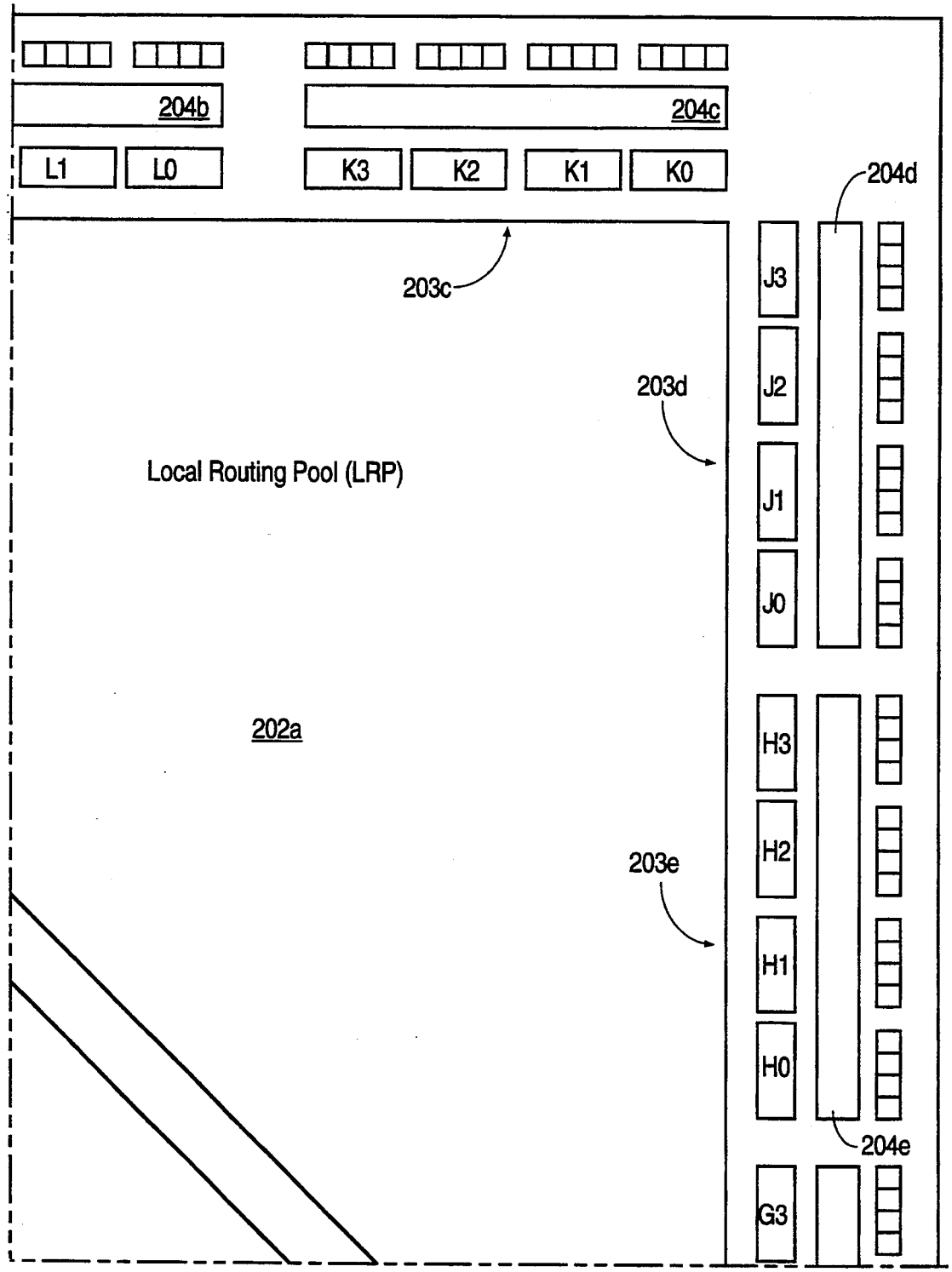

FIG. 2a shows, in one embodiment of the present invention, a programmable logic device 200 including 12 "megablocks" 203a–203l. Each megablock includes four generic logic blocks ("GLBs", e.g. GLB M0-M3 in megablock 203a), an output routing pool (e.g. output routing pool 204a), and 16 I/O cells (e.g. I/O cell 205a-1 or 205a-16). In addition, programmable logic device 200 includes a clock distribution structure 206, two local routing pools ("LRP") 202a and 202b, and a global routing pool ("GRP") 201. LRPs 202b and 202a provide connectivity among GLBs A0-F3, and GLBs G0-M3 respectively. GRP 201 provides connectivity between LRPs 202a and 202b.

Clock distribution network 206 can receive from outside programmable logic device 200 five clock signals on five dedicated clock pins. GLB G0 can also be configured to generate additional clock signal inputs to clock distribution network 206. Five clock signals (three for logic blocks, e.g. GLBs, and two for I/O cells) can be distributed from clock distribution network 206 to any GLBs or I/O cell of programmable logic device 200.

Figures 2, 2A, 3:
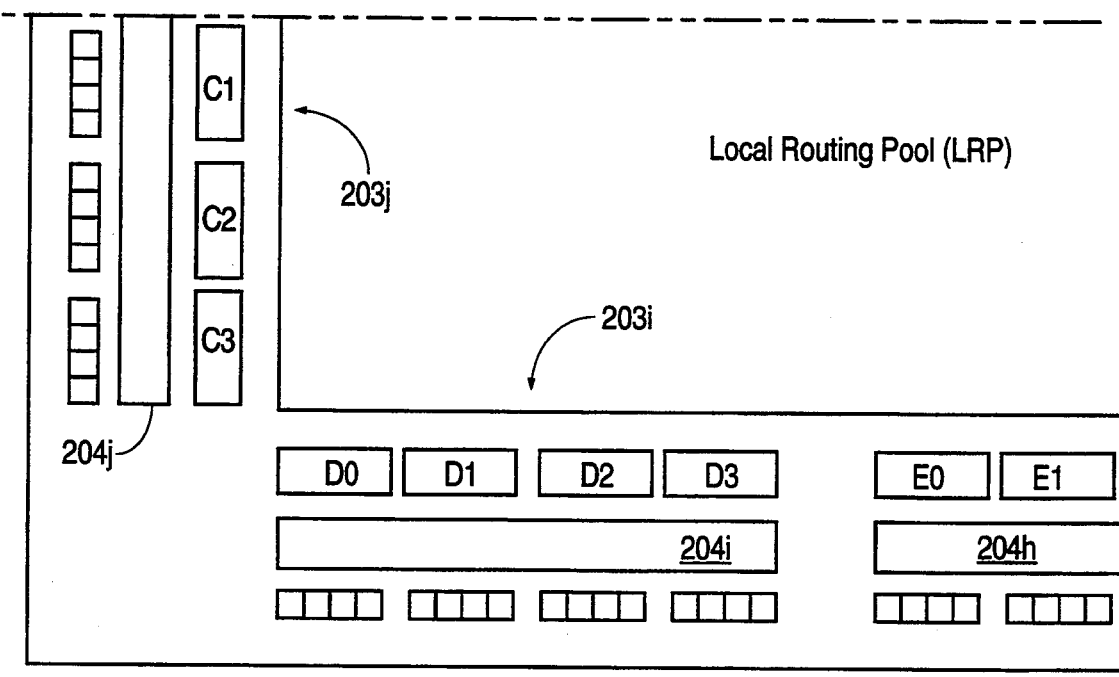
FIG. 3 shows the interconnect resources LRPs 202a and 202b, and GRP 201.
Figures 2, 2A, 3, 4:
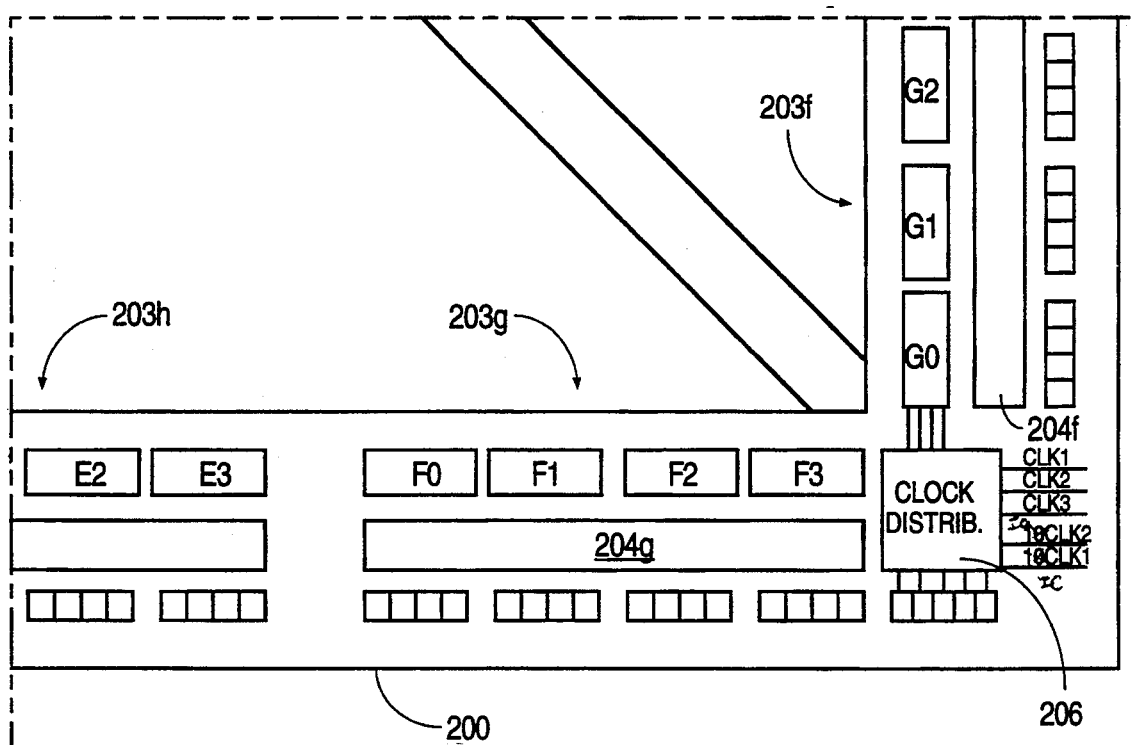
Figures 1, 2B:
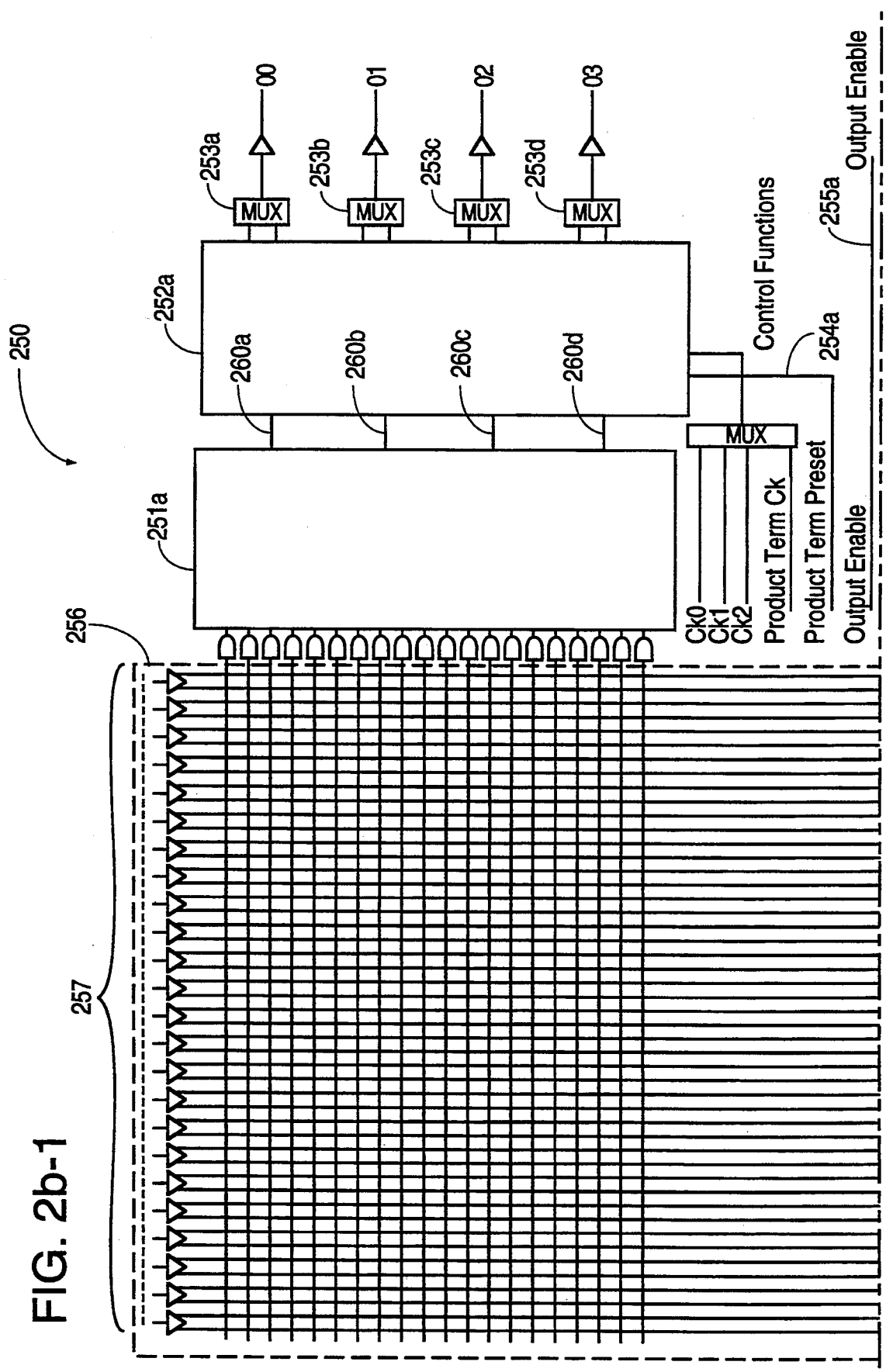

FIG. 2b shows a typical structure 250 of a GLB in programmable logic device 200. As shown in FIG. 2b, each GLB has 24 input terminals (collectively referred to as input terminals 257), eight output terminals O1–O7, and an AND array 256. Input terminals 257 carry signals to AND array 256 from the LRP (say, LRP 202a) which serves GLB 250. AND array 256 receives (a) output signals of GLBs served by LRP 202a, (b) output signals from I/O cells in the megablocks which includes GLBs served by LRP 202a, and (c) output signals received over GRP 201. The signals received over GRP 201 include output signals of GLBs served by LRP 202b, and output signals from I/O cells in the megablocks which includes the GLBs served by LRP 202b. AND array 256 also receives four internal "fast feedback" signals from the product-term sharing arrays ("PTSAs") 251a and 251b of GLB 250.

AND array 256 generates 2 groups of twenty product-term signals. Each product-term signal, which is provided both in logic true and the complement forms, is a logic product involving any number of the input signals received into AND array 256. In FIG. 2b, a first group of twenty product term signals is received by PTSA 251a, and a second group of twenty product term signals is received by PTSA 251b. Product-term sharing arrays, such as PTSAs 251a and 251b, are discussed in detail in U.S. Pat. No. 5,130,574, entitled "Programmable Logic Device Providing Product Term Sharing and Steering to the Outputs of the Programmable Logic Device," to J. Shen et al, filed on May 6, 1991, issued on Jul. 14, 1992, and assigned to Lattice Semiconductor Corporation. U.S. Pat. No. 5,130,574 is hereby incorporated by reference in its entirety.

Output stage 252a includes output logic macrocells providing various programmable logic functional capabilities for generating either a registered or a combinatorial output signals of PTSA 251a. This type of logic macrocells used in output stage 252a are discussed in detail in U.S. Pat. No. 5,191,243, entitled "Output Logic Macrocell with Enhanced Functional Capabilities," to J. Shen et al, filed on May 6, 1991 and issued on Mar. 2, 1993. U.S. Pat. No. 5,191,243 is hereby incorporated by reference in its entirety.

The output signals of multiplexer 253a–253d are provided as output signals O0–O3. Output signals O0–O3 are routed back to LRP 202a or, via the output routing pool of GLB 250's megacell, to the associated I/O cells.

Figure 2C:
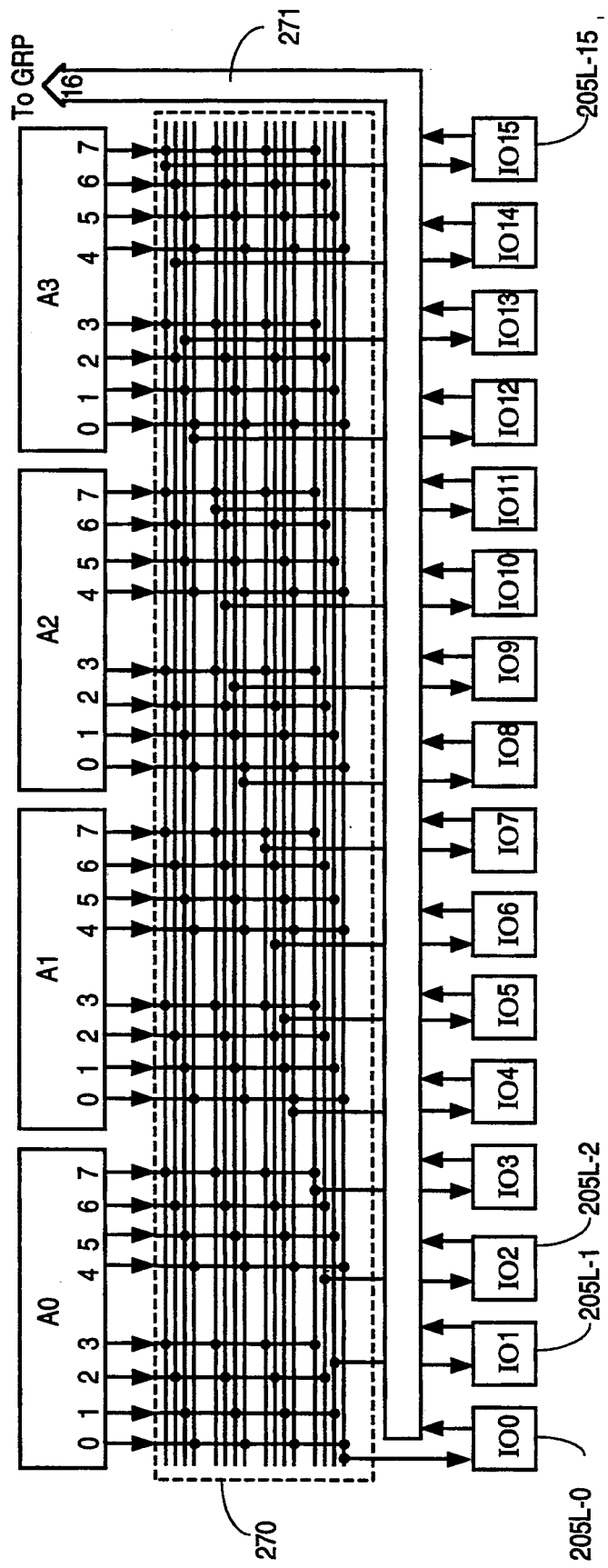
FIG. 2c shows output routing pool 204l in programmable logic device 200 of FIG. 2b.

FIG. 2c shows output routing pool 2041, which serves GLB 2041 of programmable logic device 200 (FIG. 2a). As shown in FIG. 2c, GLBs A0–A3 are connected to a switch matrix 270. Switch matrix 270 receives from GLB A0–A3 their 32 output signals, and provides 16 output signals to I/O pins 2051-0 to 2051-15. Each of the 32 output signals of GLB A0–A3 is routed to four I/O cells. I/O cells 2031-0 to 2031-15 can each be configured as an input pin, an output pin, or a bidirectional pin. When configured as an input pin, the input signal received is routed via bus 271 to LRP 202b.

Figure 2D:
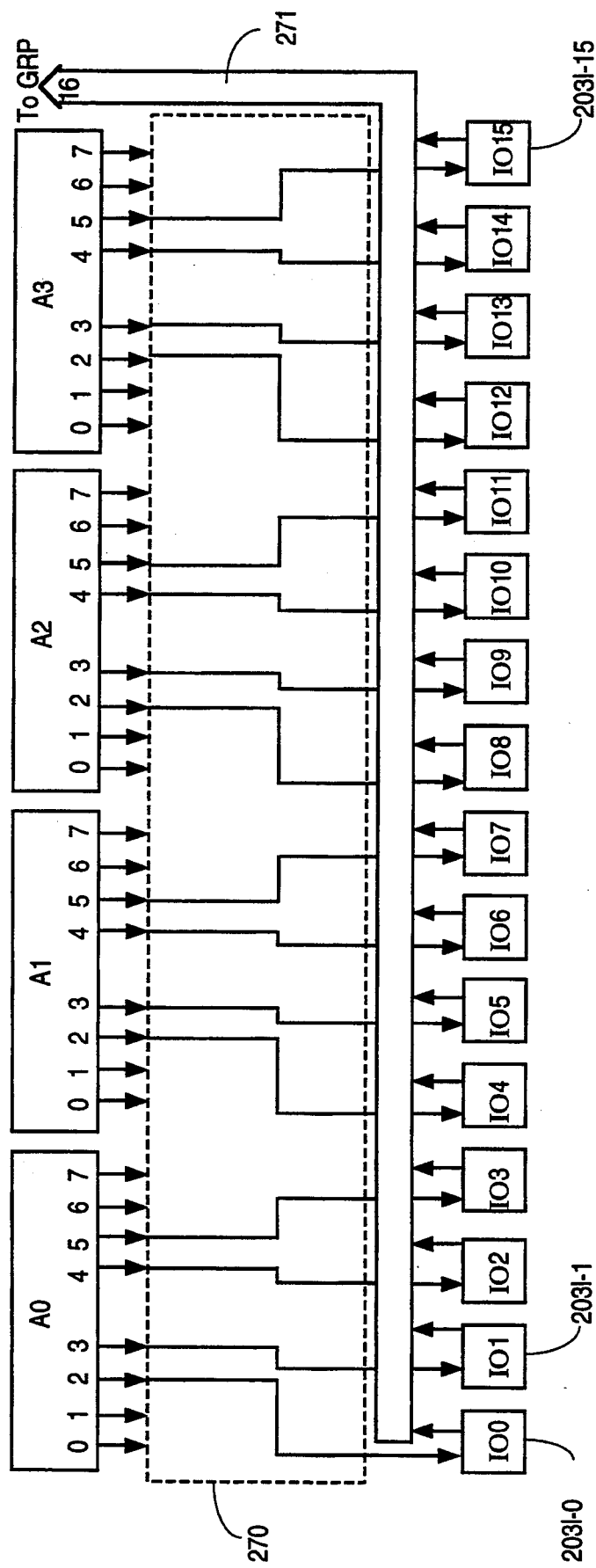
FIG. 2d shows output routing pool 204l of programmable logic device 200 of FIG. 2b, showing a bypass mechanism.
Figure 3:
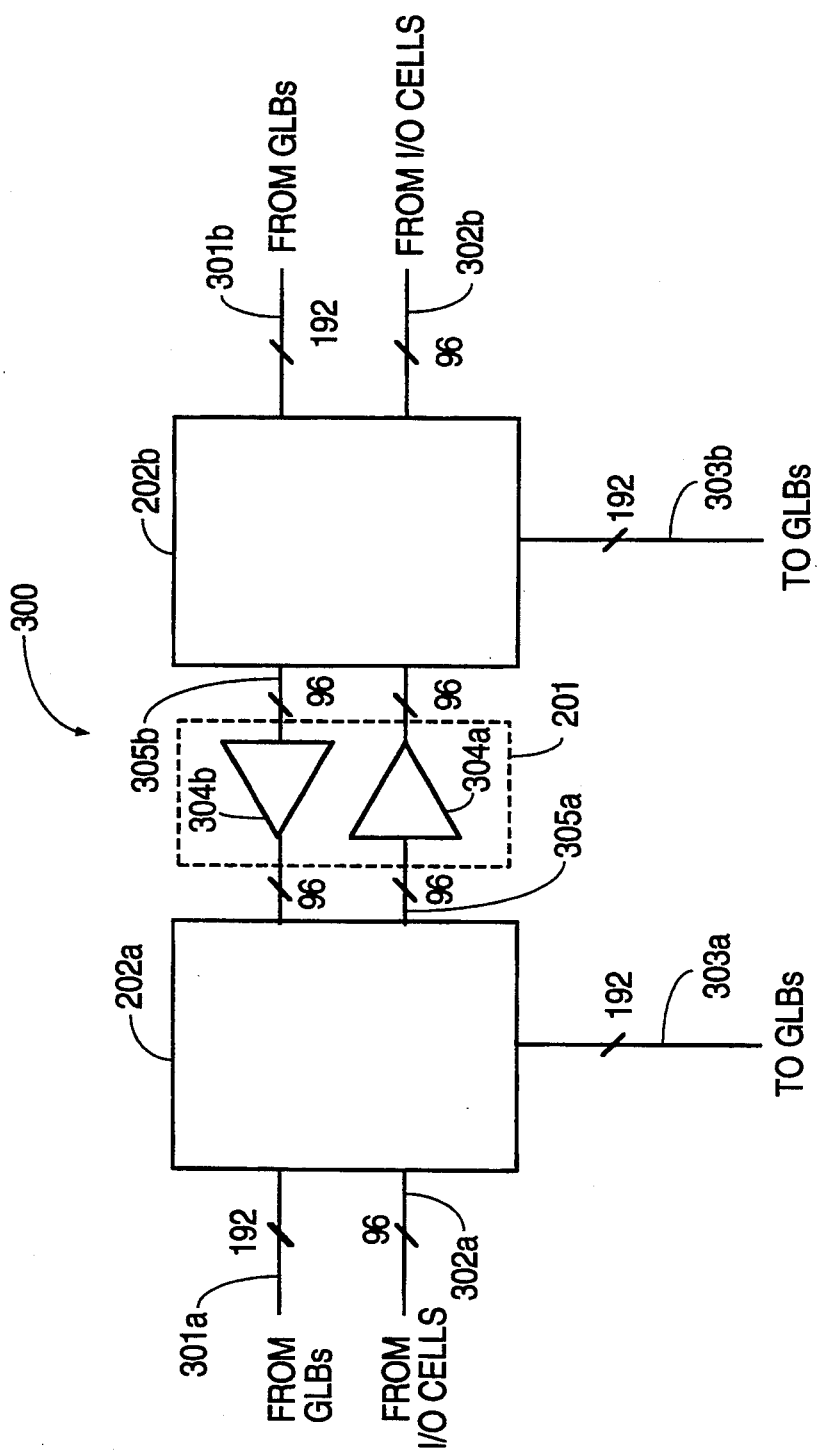

To provide higher speed connections, four of the eight output terminals of each GLB are provided programmable bypass signal paths to four I/O cells. These bypass connections are shown in FIG. 2d.

LRP 202a and LRP 202b are interconnection resources serving GLBs G0-M3, and A0-F3, as shown in FIG. 2a. FIG. 3 is a block diagram of a structure 300 implementing LRP 202a, LRP 202b, and GRP 201. As shown in FIG. 3, each LRP has (i) 96 input terminals, collectively indicated by reference numeral 302a or 302b, receiving input signals from the I/O cells associated with the GLBs served by the LRP, (ii) 192 input terminals, collectively indicated by reference numeral 301a or 301b, receiving input signals from the eight output signals from the GLBs served by the LRP, (iii) 96 input terminals, collectively indicated by reference numeral 305a or 305b, for receiving from GRP 201 signals which originate from the other LRP, and (iv) 192 output terminals, collectively indicated by reference numeral 303a or 303b, for routing each of the 288 input signals received by the LRP to 96 of the input terminals of the GLBs served by the LRP. LRP 202a and 202b are each implemented according to the interconnect structure discussed in U.S. Pat. No. 5,204,556, entitled "Programmable Interconnect Structure for Logic Blocks," by Kapil Shankar, filed May 6, 1991, issued Apr. 26, 1993 and assigned to Lattice Corporation, which is the Assignee of the present application. U.S. Pat. No. 5,204,556 is hereby incorporated by reference in its entirety. LRP 202a provides 96 output terminals to route signals through GRP 201 to LRP 202b. Likewise, LRP 202b provides 96 output terminals to route signals through GRP 201 to LRP 202a.

GRP 201 interconnects LRP 202a and 202b. To improve performance, the interconnections 305a and 305b are provided buffers, which are collectively indicated by reference numerals 304a and 304b respectively. Using GRP 201 to interconnect LRP 202a and 202b maintains connectivity between GLBs A0-F3 (served by LRP 202b) and GLBs G0-M3 (served by LPR 202b), while routing only a fraction of total number of signals received by LRPs 202a and 202b. Consequently, significant reduction of silicon area is achieved. Structure 300 can be optimally used by preferentially implementing interconnected logic circuits in GLBs served by the same LRP, thereby reducing the number of signals required to cross over via GRP 201. Under such condition, signals between GLBs are, in most cases, transmitted over an LRP, which is a smaller interconnection circuit than the alternative under a single routing pool system. Thus, despite the increase in the number of GLBs in the programmable logic device, the signal delays in transmission through the interconnection circuit are kept generally low. Because of the reduced load in the LRP, which serves a smaller number of GLBs, the AC switching currents are generally also kept low. LRP 202a and LRP 202b, and GRP 201 are each regular in structure, so that signal delays either within each LRP or over GRP 201 remain predictable and consistent.

Figure 4A:
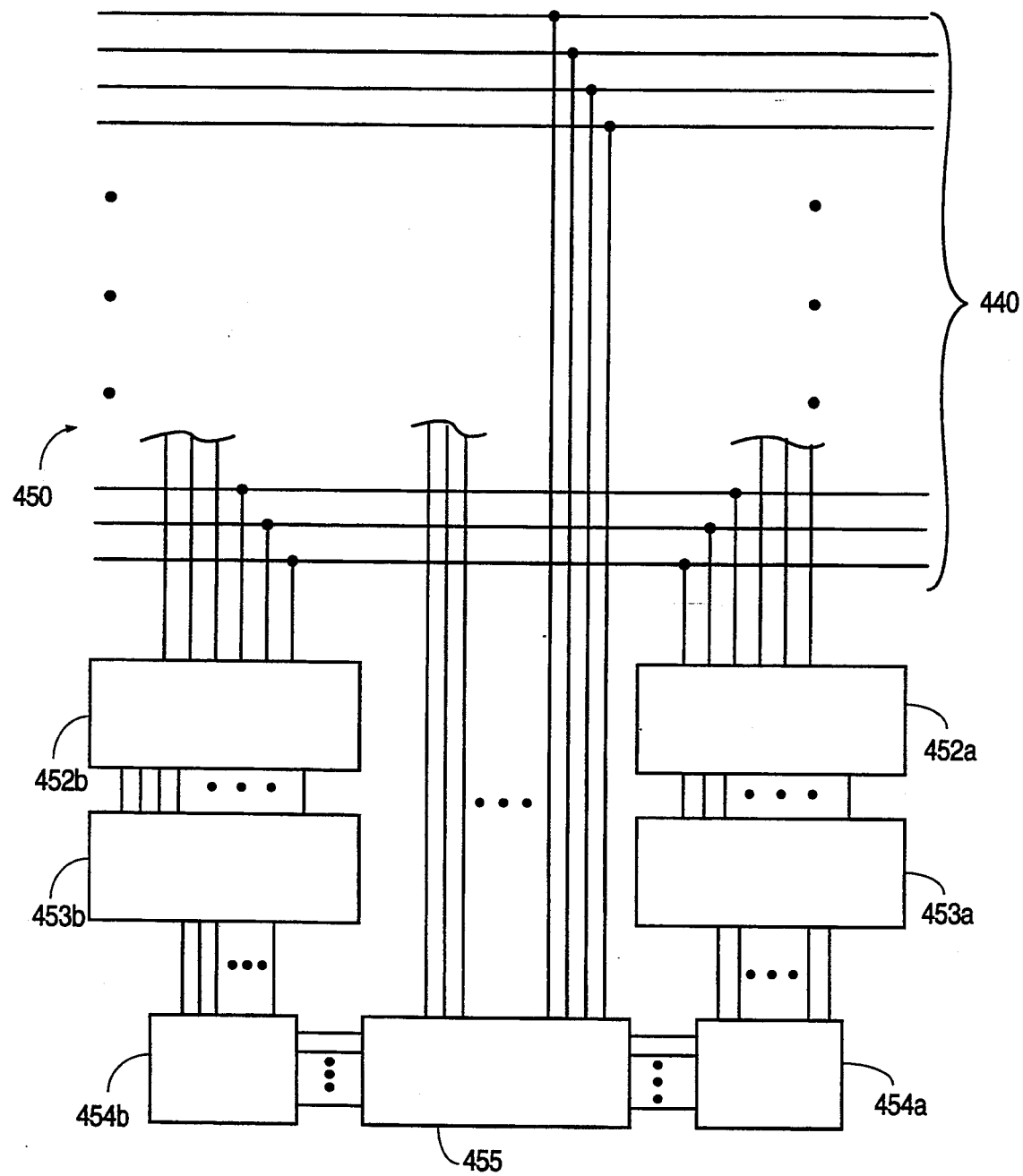
FIG. 4a shows an input routing resource 450 multiplexing a number of input signals each to multiple interconnections of a routing resource 440, in accordance with the present invention.

FIG. 4a shows an input routing resource 450 multiplexing a number of input signals each to multiple interconnections of a routing resource 440, in accordance with the present invention. As shown in FIG. 4a, routing resource 440 can be a single level global routing resource, or a multi-level routing resource, such as GRP 201 and LPRs 202a and 202b disscussed above. Routing resource 440 routes input signals to GLBs 452a and 452b. Output signals of GLBs 452a and 452b are respectively routed by output routing pools 453a and 453b, which in turn, provide output signals to the I/O cells represented by reference numerals 454a and 454b respectively. I/O cells 454a and 454b control a number of I/O pins, which can each be configured by I/O cells 454a and 454b as an input, an output or a bidirectional pin. Input signals received by I/O pins controlled by I/O cells 454a and 454b are routed to multiplexor 455, which multiplexes each of these input signals to a fixed number of lines in routing resource 440. Thus, each input signal received at an I/O pin of the programmable logic device can be routed through routing resource 440 to any GLB of the programmable logic device.

Figure 4B:
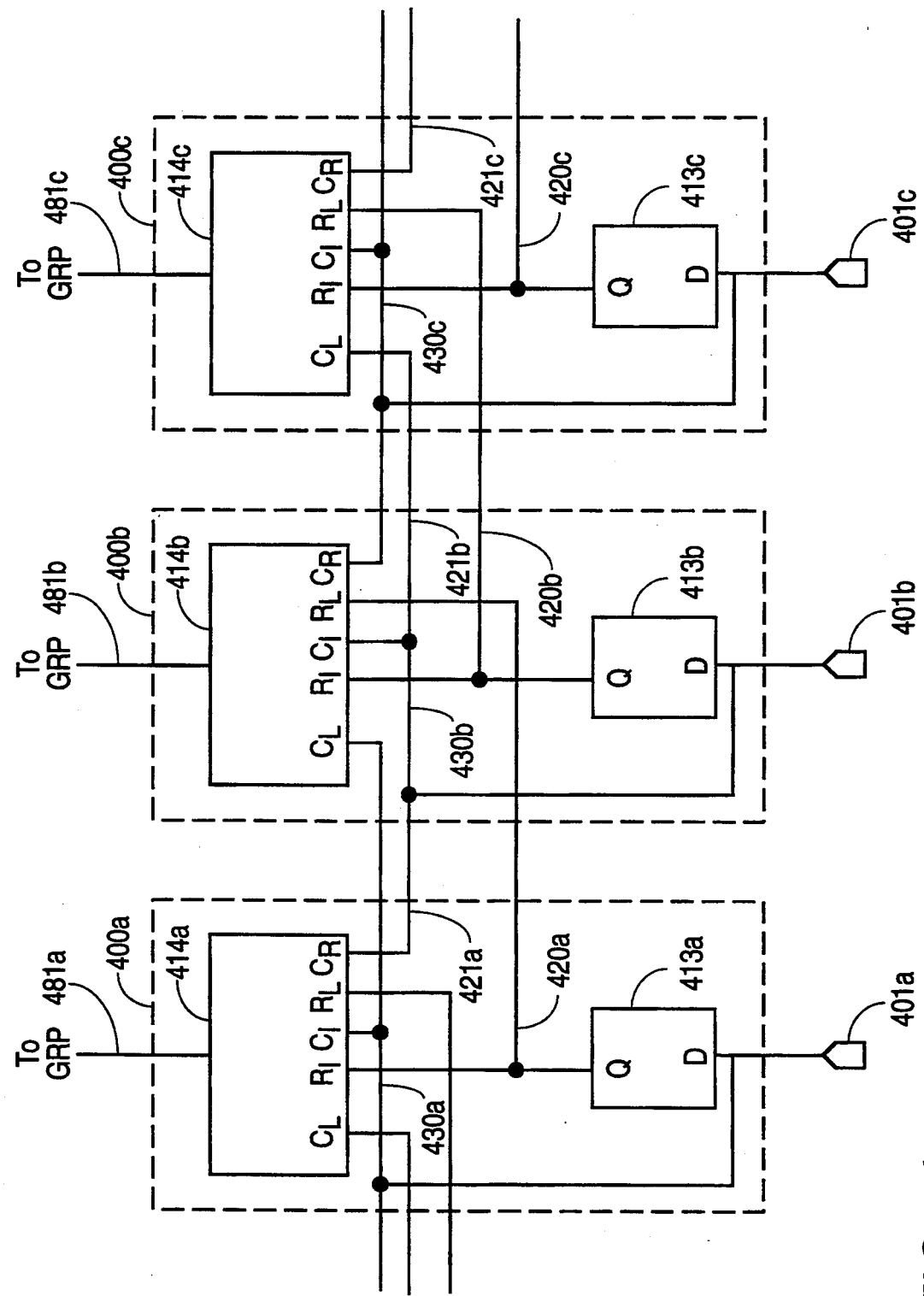
FIG. 4b shows input routing among adjacent I/O cells.

FIG. 4b shows, in one embodiment of the present invention, the interconnection between adjacent I/O cells 400a, 400b and 400c. Each I/O cell can be configured for receiving an input signal to programmable logic device 200 from an I/O pin, e.g. I/O pin 401a. Within each I/O cell are a register, e.g. register 413a, and a multiplexor, e.g. multiplexor 414a. The input signal received from I/O pin 401a is received into I/O cell 400a. I/O cell 400a latches the input signal into register 413a, which provides the registered (i.e. synchronized) input signal to multiplexer 414a on lead 420a. Multiplexor 414a also receives the input signal at pin 401a as a combinatorial signal on lead 430a. To allow flexibility in routing the input signal received at each I/O pin, the input signal at eac I/O pin can be routed through multiple I/O cells. For example, the signal received at I/O pin 401b is provided to multiplexors 414a, 414b and 414c as a combinatorial signal. In addition, the registered input signal 420b of I/O cell 400b is provided to both multiplexors 414b and 414c. As illustrated in FIG. 4b, multiplexor 414b of I/O cell 400b is therefore able to route on lead 481b to the associated local routing pool (e.g. LRP 201b) a signal selected from: (i) a combinatorial signal received from I/O pin 401a, (ii) a combinatorial signal received from I/O pin 401b, (iii) a combinatorial signal received from I/O pin 401c, (iv) a registered signal received via register 413a from I/O pin 401a, and (v) a registered signal received via register 413b from I/O pin 401b.

Figures 1, 4C:
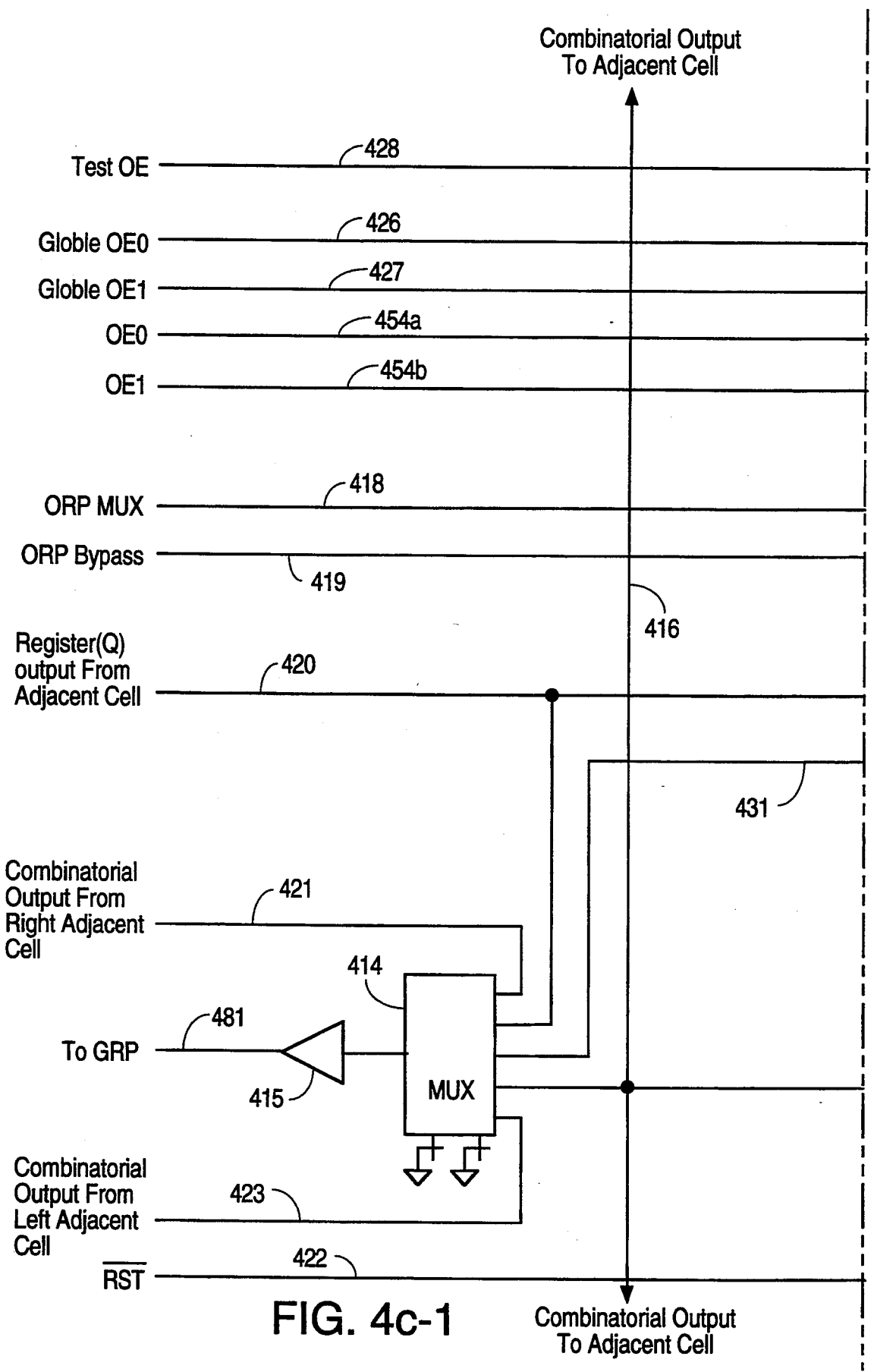
FIG. 4c shows an I/O cell 400, including the output enable structure of the present invention.
Figures 2, 4C:
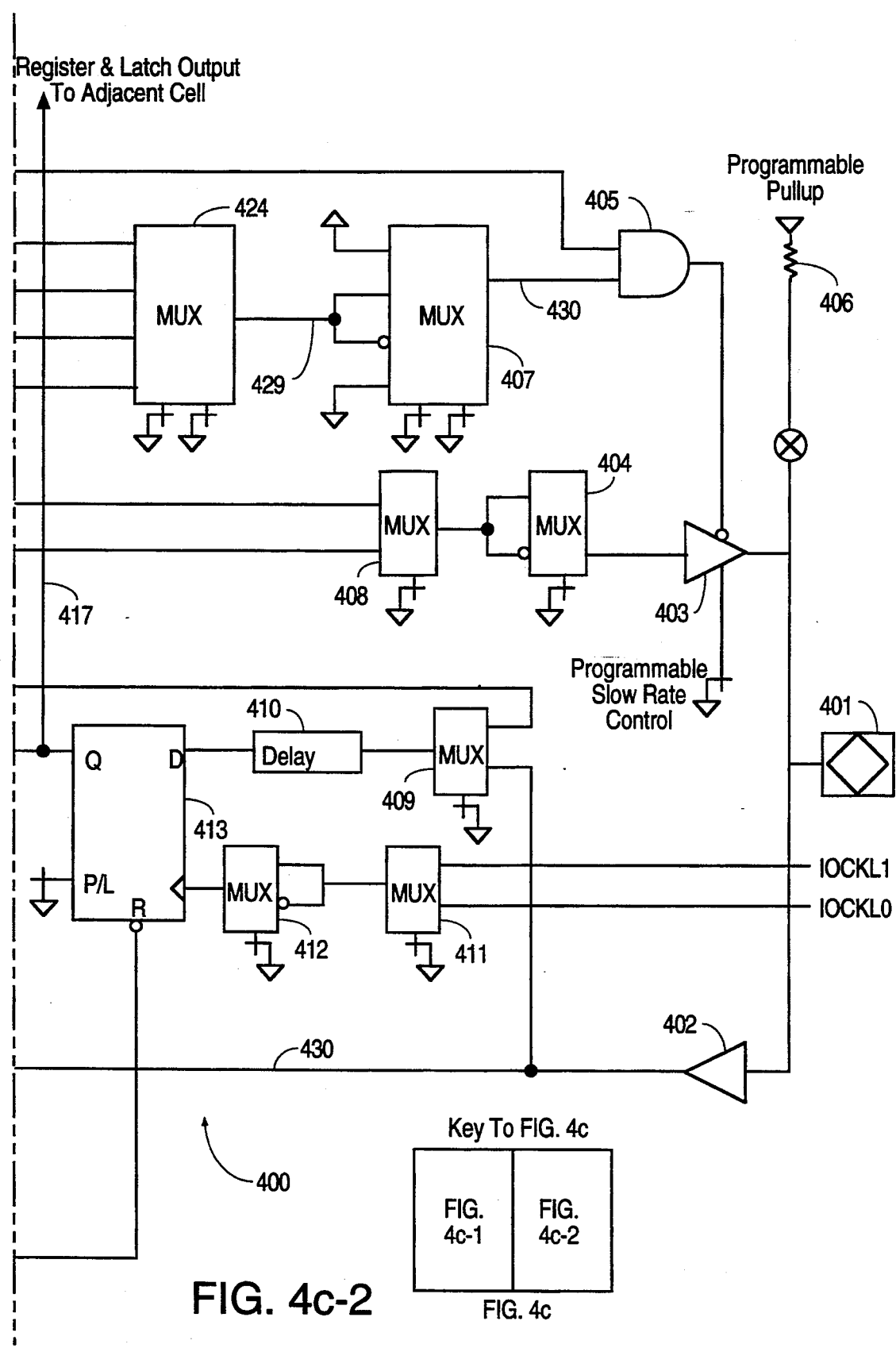

FIG. 4c shows an I/O cell 400, which is representative of I/O cells 400a–400c shown in FIG. 4b. As shown in FIG. 4c, I/O cell 400 receives two output enable signals on leads 454a and 454b (see also FIG. 4b), and two global output enable signals on leads 426 and 427. The two global output enable signals are output enable signals received by dedicated output enable pins in programmable logic device 200 and routed through GRP 201 to every I/O cell in programmable logic device 200.

Multiplexor 424 selects for I/O cell 400 an output enable signal on lead 429 from among the output enable signals on lead 454a and 454b, and the global output enable signals on leads 426 and 427. This output enable signal on lead 429 and its complement can be used to control output at I/O cell 400. Multiplexor 407 can also be programmed to unconditionally enable and disable output by I/O cell 400. The output signal of multiplexor 407 is ANDed with a test output enable signal TEST OE on lead 428, to provide a capability to enable data output under test mode. The test enable signal TEST OE is received into programmable logic device 200 through a dedicated I/O pin. The dedicated pin of TEST OE can be loaded by a relatively large capacitor, so that, when programmable logic device 200 powers up, the signal TEST OE rises slowly. A slow rise time in the TEST OE signal disables output at the I/O pins until initialization is complete.

Data output reaches I/O cell 400 through output routing pool, such as output routing pool 204l, to multiplexer 408, which is programmed to select from either the standard signal path through output routing pool 204l, or a bypass connection, such as one of the bypass connections shown in FIG. 2d. The output data or its complement is provided by multiplexor 404 to buffer 403 for output through input/output pin 401. An optional programmable pullup can be configured at input-/output pin 401 to prevent propagation of noise when output buffer 403 is in the high impedance state.

As discussed above, when configured for receiving an input signal, I/O cell 400 provides the input signal to the remainder of programmable logic device 200 as either a "combinational" input (i.e. asynchronous) signal, or a "registered" input (i.e. synchronous) signal. Synchronization is provided by register 413 which is clocked by one of two clock signals received from the clock distribution network 206. The clock signal for register 413 is selected by programming multiplexors 411. Multiplexer 412 provides a choice between the selected clock signal and its complement. As shown in FIG. 4b, this embodiment provides additional signal routing capabilities by routing the registered input signal to a neighboring I/O cell, and routing the combinational input signal to two neighboring I/O cells. Multiplexor 414 receives the registered input signal on lead 430, the combinational input signal on lead 431, two combinational input signal from two neighboring I/O cells on lead 421 and 423, and a registered input signal from a neighboring I/O cell on lead 420. The output signal on lead 481 of multiplexor 414 is routed to the associated LRP as an input signal received by programmable logic device 200. Because an input signal received from I/O pin 401 into I/O cell 400 can be routed to at least two neighboring I/O cells, additional level flexibility in pin-out configuration is achieved for programmable logic device 200.

The above detailed description is illustrative of the specific embodiments of the present invention and is not intended to be limiting. Many modifications and variations within the scope of the present invention are possible. The configuration of an I/O cell can be implemented in either volatile or non-volatile memory technology, depending on whether programming on power-up is desired. Using in-system programming techniques, the selections of input signals in the I/O cells can be reprogrammed in-system without removal of the integrated circuit from its circuit board. In-system programming techniques are discussed in U.S. Pat. No. 4,855,954 (entitled "In-system Programmable Logic Device with Four Dedicated Terminals" to Turner et al, issued Aug. 8, 1989), U.S. Pat. No. 4,761,768 (entitled "Programmable Logic Device", to Turner et al, issued Aug. 2, 1988), and U.S. Pat. No. 4,896,296 (entitled "Programmable Logic Device Configurable Input-/Output Cell" to Turner et al, issued Jan. 23, 1990) The in-system programming techniques discussed in these U.S. Patents are hereby incorporated by reference.

The present invention is defined by the following claims.

I claim:

1. In a programmable logic device, a structure comprising:
   a plurality of programmable logic blocks;
   a routing resource for interconnecting said programmable logic blocks, said routing resource receiving signals from a plurality of interconnection lines and routing said signals to said programmable logic blocks;
   a first pin configured to receive a first input signal;
   a second pin configured to receive a second input signal; and
   means, receiving said first and second input signals from said first and second pins, for multiplexing each of said first and second input signals to more than one of said interconnection lines.

2. A structure as in claim 1, wherein said first and second pins are controlled respectively by first and second I/O cells, said structure further comprising:
   a multiplexor in said first I/O cell coupled to receive said first and second input signals, said multiplexor of said first I/O cell providing to said routing resource one of said first and second input signals as an output signal of said first I/O cell; and
   a multiplexor in said second I/O cell coupled to receive said first and second input signals, said multiplexor of said second I/O cell providing to said routing resource one of said first and second input signals as an output signal of said second I/O cell.

3. In a programmable logic device, a structure comprising:
   a plurality of programmable logic blocks;
   a routing resource for interconnecting said programmable logic blocks, said routing resource receiving signals from a plurality of interconnection lines and routing said signals to said programmable logic blocks;
   a first pin configured to receive a first input signal;
   a second pin configured to receive a second input signal; and
   means, receiving said first and second input signals from said first and second pins, for multiplexing each of said first and second input signals to more than one of said interconnection lines;
   wherein said first and second pins are controlled respectively by first and second I/O cells, said structure further comprising:
      a multiplexor in said first I/O cell coupled to receive said first and second input signals, said multiplexor of said first I/O cell providing to said routing resource one of said first and second input signals as an output signal of said first I/O cell; and
      a multiplexor in said second I/O cell coupled to receive said first and second input signals, said multiplexor of said second I/O cell providing to said routing resource one of said first and second input signals as an output signal of said second I/O cell;
   wherein said first I/O cell further comprises a register, coupled to receive a clock signal and said first input signal from said first input pin, to provide a registered input signal synchronized to said clock signal, and
   wherein said multiplexor of said first I/O cell, coupled to receive said registered input signal, selects as said output signal of said first I/O cell one of: (i) said registered input signal, (ii) said first input signal, and (iii) said second input signal.

4. In a programmable logic device, a structure comprising:
   a plurality of programmable logic blocks;
   a routing resource for interconnecting said programmable logic blocks, said routing resource receiving signals from a plurality of interconnection lines and routing said signals to said programmable logic blocks;
   a first pin configured to receive a first input signal;
   a second pin configured to receive a second input signal; and
   means, receiving said first and second input signals from said first and second pins, for multiplexing each of said first and second input signals to more than one of said interconnection lines;
   wherein said first and second pins are controlled respectively by first and second I/O cells, said structure further comprising:
      a multiplexor in said first I/O cell coupled to receive said first and second input signals, said multiplexor of said first I/O cell providing to said routing resource one of said first and second input signals as an output signal of said first I/O cell; and
      a multiplexor in said second I/O cell coupled to receive said first and second input signals, said multiplexor of said second I/O cell providing to said routing resource one of said first and second input signals as an output signal of said second I/O cell;
   wherein said first and second I/O cells each comprise a register, said registers receiving said first and second input signals, respectively, and a clock signal to provide first and second registered input signals, and
   wherein said multiplexor of said first I/O cell, coupled to receive said first and second registered signals, selects as output signal of said first I/O cell one of: (i) said first registered input signal, (ii) said second registered input signal, (iii) said first input signal, and (iv) said second input signal.

5. In a programmable logic device, a structure comprising:
   a plurality of programmable logic blocks;
   a routing resource for interconnecting said programmable logic blocks, said routing resource receiving signals from a plurality of interconnection lines and routing said signals to said programmable logic blocks;
   a first pin configured to receive a first input signal;
   a second pin configured to receive a second input signal; and
   means, receiving said first and second input signals from said first and second pins, for multiplexing each of said first and second input signals to more than one of said interconnection lines;
   wherein said programmable logic device comprises elements implemented by a non-volatile memory technology.

6. In a programmable logic device, a structure comprising:
   a plurality of programmable logic blocks;
   a routing resource for interconnecting said programmable logic blocks, said routing resource receiving signals from a plurality of interconnection lines and routing said signals to said programmable logic blocks;
a first pin configured to receive a first input signal;
a second pin configured to receive a second input signal; and
means, receiving said first and second input signals from said first and second pins, for multiplexing each of said first and second input signals to more than one of said interconnection lines;
wherein said programmable logic device is programmable using in-system programming techniques.

7. In a programmable logic device, said programmable logic device having a plurality of programmable blocks and a routing resource for interconnecting said programmable logic blocks, said routing resource receiving signals from a plurality of interconnection lines and routing said signals to said programmable logic blocks, a method comprising:
receiving at a first pin a first input signal;
receiving at a second pin a second input signal; and
multiplexing each of said first and second input signals to more than one of said interconnection lines.

8. A method as in claim 7, wherein said first and second pins are controlled respectively by first and second I/O cells, further comprising the steps of:
including, in said first I/O cell, a multiplexor coupled to receive said first and second input signals, said multiplexor of said first I/O cell providing to said routing resource one of said first and second input signals as an output signal of said first I/O cell; and
including, in said second I/O cell, a multiplexor coupled to receive said first and second input signals, said multiplexor of said second I/O cell providing to said routing resource one of said first and second input signals as an output signal of said second I/O cell.

9. In a programmable logic device, said programmable logic device having a plurality of programmable blocks and a routing resource for interconnecting said programmable logic blocks, said routing resource receiving signals from a plurality of interconnection lines and routing said signals to said programmable logic blocks, a method comprising:
receiving at a first pin a first input signal;
receiving at a second pin a second input signal; and
multiplexing each of said first and second input signals to more than one of said interconnection lines;
wherein said first and second pins are controlled respectively by first and second I/O cells, said method further comprising the steps of:
including, in said first I/O cell, a multiplexor coupled to receive said first and second input signals, said multiplexor of said first I/O cell providing to said routing resource one of said first and second input signals as an output signal of said first I/O cell; and
including, in said second I/O cell, a multiplexor coupled to receive said first and second input signals, said multiplexor of said second I/O cell providing to said routing resource one of said first and second input signals as an output signal of said second I/O cell; and
including in said first I/O cell a register, coupled to receive a clock signal and said first input signal from said first input pin, to provide a registered input signal synchronized to said clock signal, and wherein said multiplexor of said first I/O cell, coupled to receive said registered input signal, selects as said output signal of said first I/O cell one of: (i) said registered input signal, (ii) said first input signal, and (iii) said second input signal.

10. In a programmable logic device, said programmable logic device having a plurality of programmable blocks and a routing resource for interconnecting said programmable logic blocks, said routing resource receiving signals from a plurality of interconnection lines and routing said signals to said programmable logic blocks, a method comprising:
receiving at a first pin a first input signal;
receiving at a second pin a second input signal; and
multiplexing each of said first and second input signals to more than one of said interconnection lines;
wherein said first and second pins are controlled respectively by first and second I/O cells, said method further comprising the steps of:
including, in said first I/O cell, a multiplexor coupled to receive said first and second input signals, said multiplexor of said first I/O cell providing to said routing resource one of said first and second input signals as an output signal of said first I/O cell; and
including, in said second I/O cell, a multiplexor coupled to receive said first and second input signals, said multiplexor of said second I/O cell providing to said routing resource one of said first and second input signals as an output signal of said second I/O cell; and
including in each of said first and second I/O cells a register, said registers receiving said first and second input signals, respectively, and a clock signal to provide first and second registered input signals, and wherein said multiplexor of said first I/O cell, coupled to receive said first and second registered input signals, selects as output signal of said I/O cell one of: (i) said first registered input signal, (ii) said second registered input signal, (iii) said first input signal, and (iv) said second input signal.

11. In a programmable logic device, said programmable logic device having a plurality of programmable blocks and a routing resource for interconnecting said programmable logic blocks, said routing resource receiving signals from a plurality of interconnection lines and routing said signals to said programmable logic blocks, a method comprising:
receiving at a first pin a first input signal;
receiving at a second pin a second input signal;
multiplexing each of said first and second input signals to more than one of said interconnection lines; and
including in said programmable logic device elements implemented by a non-volatile memory technology.

12. In a programmable logic device, said programmable logic device having a plurality of programmable blocks and a routing resource for interconnecting said programmable logic blocks, said routing resource receiving signals from a plurality of interconnection lines and routing said signals to said programmable logic blocks, a method comprising:
receiving at a first pin a first input signal;
receiving at a second pin a second input signal;
multiplexing each of said first and second input signals to more than one of said interconnection lines; and
programming said programmable logic device using in-system programming techniques.

* * * * *